United States Patent [19]

Ijichi et al.

[11] Patent Number: 4,527,280
[45] Date of Patent: Jul. 2, 1985

[54] FREQUENCY SYNTHESIZING TYPE ELECTRONIC TUNER

[75] Inventors: Sadayoshi Ijichi; Masaki Yamamoto, both of Soma, Japan

[73] Assignee: Alps Electric Co., Ltd., Japan

[21] Appl. No.: 541,553

[22] Filed: Oct. 13, 1983

[30] Foreign Application Priority Data

Oct. 13, 1982 [JP] Japan ............................ 57-154662[U]

[51] Int. Cl.³ ............................ H04B 1/26; H03L 7/18
[52] U.S. Cl. ........................................ 455/183; 331/49
[58] Field of Search ............... 455/183, 180, 165, 168; 331/2, 49, 56

[56] References Cited

U.S. PATENT DOCUMENTS

| 4,078,212 | 3/1978 | Rast ........................ 455/183 |
| 4,245,350 | 1/1981 | Moore ..................... 455/180 |
| 4,379,271 | 4/1983 | Lehmann ................ 331/49 |

Primary Examiner—Marc E. Bookbinder
Attorney, Agent, or Firm—Guy W. Shoup

[57] ABSTRACT

In a frequency synthesizer type electronic tuner comprising a plurality of local oscillators operable in frequency ranges different from each other, only one of said local oscillators being operable in accordance with a received frequency band, and the outputs of the local oscillators being connected with a prescaler constituting a PLL station selecting circuit through a coupling circuit which includes series connected circuits of resistors and capacitors, respectively, characterized in that the resistors in said coupling circuit are connected on the side thereof adjacent to the local oscillators, while the capacitors in the coupling circuit are connected on the side thereof adjacent to the prescaler, so that resistors and capacitors are used in a connecting part between the local oscillator circuit and the prescaler of the tuner thereby the separation between VHF and UHF bands is improved.

2 Claims, 7 Drawing Figures

FREQUENCY SYNTHESIZING TYPE ELECTRONIC TUNER

BACKGROUND OF THE INVENTION

This invention generally relates to electronic tuners of frequency synthesizing type, and more particularly to a type thereof wherein resistors and capacitors are used in a connecting part between the local oscillator circuit and the prescaler of the tuner such that the separation between VHF and UHF bands is improved.

In a television tuner of a frequency synthesizing type, it is an ordinary practice to apply the output frequency of a local oscillator to a frequency divider otherwise termed prescaler which divides the frequency into a value adapted to be processed in a digital circuit.

For instance, in a television tuner of frequency synthesizing type shown in FIG. 1, two local oscillators 1 and 2 are used for VHF and UHF bands, respectively, and the local oscillators are connected through a circuit 4 termed combiner which includes two constant k-type filters made of inductors and capacitors to the prescaler 3.

However, in a case the television tuner is used in a wide-band application for receiving CATV or the like besides the VHF and UHF bands, the high frequency range of the local oscillation circuit for the VHF band is closely adjacent to the lower frequency range thereof for the UHF band, and therefore the combiner 4 of the above described construction cannot be used.

More specifically, in an ordinary case where VHF and UHF bands of television broadcast are received, since the oscillating frequencies of the local oscillators are widely separated, the combiner 4 having a frequency characteristic as shown in FIG. 2 and operable as a frequency splitter can be utilized. However, in a case of a wide-band application for receiving, for instance, CATV, the frequency ranges of the tuner for these bands are closely adjacent or in an overlapping relation, so that the combiner or splitter 4 of the frequency characteristic shown in FIG. 2 cannot be used any more. In the latter case, a combiner or splitter 4 of a characteristic as shown in FIG. 3 is required to be used, which in turn causes a disadvantage of making it difficult to maintain independent operations of the local oscillators 1 and 2 in those frequency ranges adjacent to each other or overlapping with each other, but causing interruption or absorption phenomenon of the oscillators.

Furthermore, in a case of a wide-band tuner including three or more local oscillators, one for a lower VHF band, one for a higher VHF band, and others for the UHF band, the above described difficulties still exist, and therefore the circuitry of the electronic tuner is complicated, for instance, by the necessity of providing a band-pass characteristic for the LC splitter for the local oscillator provided for the higher frequency range of the VHF band.

For obviating these difficulties, there has been proposed a construction shown in FIG. 4 wherein local oscillators 1 and 2 are connected with the prescaler 3 through respective series connected circuits of a capacitor 5 and a resistor 6, and a capacitor 7 and a resistor 8. With this construction, not only the frequency characteristic shown in FIG. 3 can be obtained, but also a disadvantageous feature such as one of the local oscillators becomes the load of the other local oscillator can be eliminated by the existence of the resistors 6 and 8. In other words, adverse mutual actions between the VHF and UHF oscillators can be substantially eliminated.

In a case where the capacitors 5 and 7 in FIG. 4 are placed on the side of the local oscillators 1 and 2, and the resistors 6 and 8 are located on the other side adjacent to the prescaler 3, the above described connection may be schematically depicted as shown in FIG. 6 wherein only one half comprising the local oscillator 1, prescaler 3, capacitor 5 and the resistor 6 is indicated for the simplicity of the drawing.

As shown by dotted lines in FIG. 6, stray capacitances are formed between copper foils 9, each connected with the capacitor and the resistor, and the ground. Accordingly, as is apparent in FIG. 4, a series connected circuit of the capacitor 5 and one of the stray capacitances constitutes a load of the local oscillator 1, while another series connected circuit formed by the capacitor 7 and the other stray capacitance constitutes a load of the local oscillator 2. As a result, the capacitance in each tuning circuit for the local oscillator 1 or 2 increases, thus reducing the variable range of the oscillation frequency. In a worst case where the increase of the capacitance is excessive, the oscillation of the local oscillator tends to be interrupted in a range where the tuning voltage is low. Such a phenomenon is not advantageous for a wide band tuner for receiving CATV or the like, wherein a wide variable frequency range is required.

SUMMARY OF THE INVENTION

An object of the present invention is to provide a frequency synthesizer type electronic tuner wherein all of the above described difficulties can be substantially eliminated.

Another object of the invention is to provide a frequency synthesizer type electronic tuner wherein the operations of the local oscillators for VHF and UHF bands are sufficiently separated from each other and maintained free from the influence of the stray capacitances.

These and other objects of the present invention can be achieved by a frequency synthesizer type electronic tuner comprising a plurality of local oscillators operable in frequency ranges different from each other, only one of the local oscillators being operable in accordance with received frequency band, and the outputs of the local oscillators being connected with a prescaler constituting a PLL station selecting circuit through a coupling circuit which includes series connected circuits of resistors and capacitors, respectively, the improvement wherein the resistors in the coupling circuit are connected on the side thereof adjacent to the local oscillators, while the capacitors in the coupling circuit are connected on the side thereof adjacent to the prescaler.

The invention will be described in more detail with reference to the accompanying drawings.

DESCRIPTION OF THE PREFERRED EMBODIMENT

Figure 5:
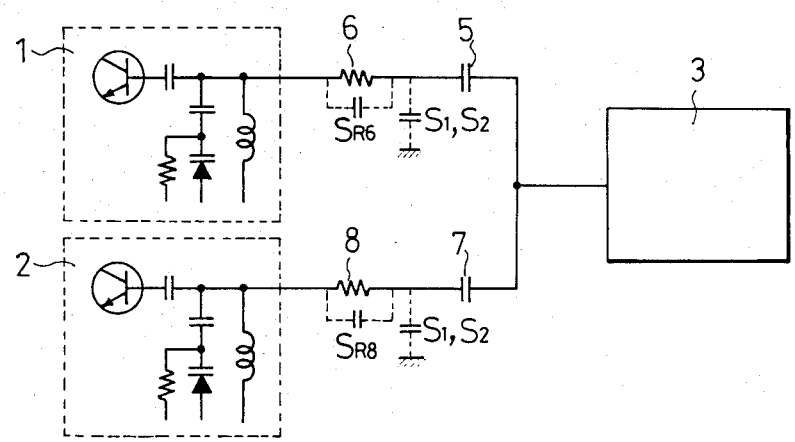
FIG. 5 is a circuit diagram showing a preferred embodiment of the present invention.
Figure 7:
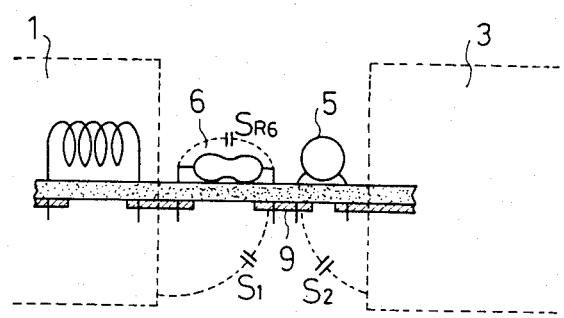
FIG. 7 is a schematic diagram used for explaining the operation of the embodiment shown in FIG. 5.

A preferred embodiment of the present invention will now be described with reference to FIGS. 5 and 7.

As will be apparent from these drawings, resistors 6 and 8 of the coupling circuit in this embodiment are provided on the side adjacent to the local oscillators 1 and 2, while capacitors 5 and 7 of the coupling circuit are provided on the side adjacent to the prescaler 3. In FIG. 7, although only one circuit including local oscillator 1, resistor 6, capacitor 5 and prescaler 3 is indicated for simplification of the drawing, it is apparent that another circuit including local oscillator 2 and others is connected in a similar manner as that shown in FIG. 7. As is indicated by dotted lines in FIG. 7, a stray capacitance $S_{R6}$ of the resistor 6 and stray capacitances $S_1$ and $S_2$ of a copper foil 9, provided at the junction of the resistor 6 and the capacitor 5, are serially connected to form an additional load of the local oscillator 1. Likewise a stray capacitance $S_{R8}$ of the resistor 8 and stray capacitances $S_1$ and $S_2$ of another copper foil 9 are serially connected to form an additional load of the local oscillator 2.

Figure 1:
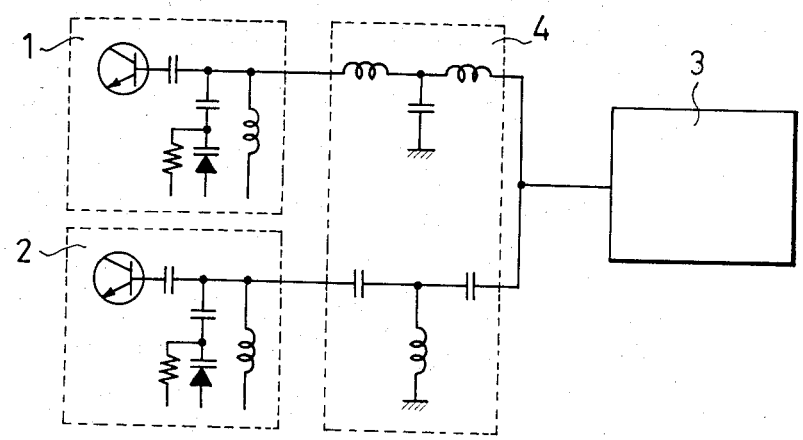
FIG. 1 is a circuit diagram showing a conventional television tuner of a frequency syntherizer type.
Figure 2:
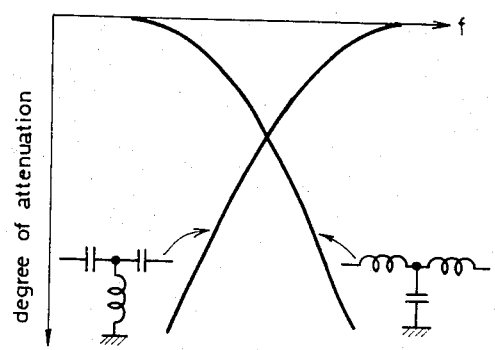
FIGS. 2 and 3 are graphical representations of the characteristics of combiners.
Figure 3:
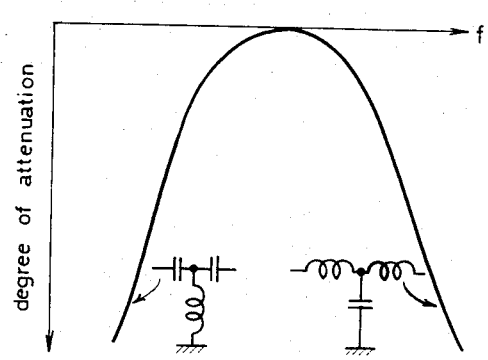
Figure 4:
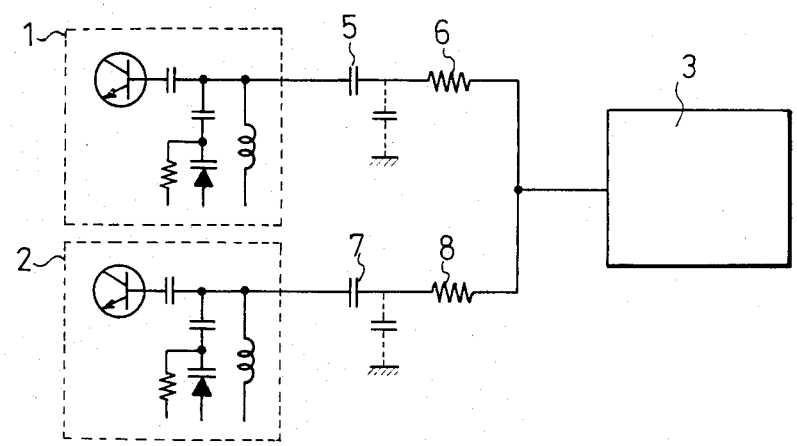
FIG. 4 is a circuit diagram showing a television tuner including a coupling circuit made of capacitors and resistors.
Figure 6:
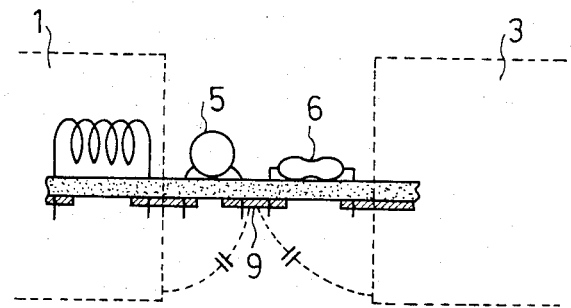
FIG. 6 is a schematic diagram used for explaining the operative condition of the coupling circuit provided in FIG. 4.

Since the stray capacitances $S_{R6}$ and $S_{R8}$ of the resistors 6 and 8 are extremely small, the additional loads formed by the series connection of the stray capacitance $S_{R6}$ or $S_{R8}$ and stray capacitances $S_1$ and $S_2$ are negligibly small. As a consequence there is no possibility of increasing the capacitance of the tuning circuit of the local oscillator as in the case of FIGS. 4 and 6, and the above described disadvantages of reducing the variable frequency range of the local oscillator or interrupting the operation of the same can be substantially eliminated.

According to the present invention, there is provided a frequency synthesizing type electronic tuner which is not only capable of separating VHF band and UHF band when used as a wide band tuner, but also can eliminate possibility of reducing the variable range of frequency and interrupting the operation of the local oscillator due to the stray capacitances of the capacitor and resistor provided in the coupling circuit. It is apparent that the electronic tuner of the above described property is stably operable even in CATV application.

We claim:

1. In a phase locked loop frequency synthesizer type electronic tuner comprising a plurality of local oscillators operable in frequency bonds different from each other, only one of said local oscillators being operable in accordance with a selected reception frequency band, and a coupling circuit connecting outputs of the local oscillators to a prescaler, said coupling circuit including a respective series connected resistor/capacitor pair associated with each of said oscillators the improvement wherein the resistors in said resistor/capacitor pairs are connected so as to be electrically adjacent to the local oscillators and the capacitors in said resistor/capacitor pairs are connected so as to be electrically adjacent to the prescaler.

2. A phase locked loop frequency synthesizer type electronic tuner as set forth in claim 1 wherein said plurality of local oscillators are operable in frequency ranges closely adjacent to each other.

* * * * *